US012665043B2

(12) United States Patent　　　(10) Patent No.:　US 12,665,043 B2
Huang et al.　　　　　　　　　　(45) Date of Patent:　Jun. 23, 2026

(54) MEMORY SUB-SYSTEM THRESHOLD VOLTAGE MODIFICATION OPERATIONS

(71) Applicant: Micron Technology, Inc., Boise, ID (US)

(72) Inventors: Jian Huang, Boise, ID (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 187 days.

(21) Appl. No.: 18/205,083

(22) Filed: Jun. 2, 2023

(65) Prior Publication Data

US 2023/0395176 A1　Dec. 7, 2023

Related U.S. Application Data

(60) Provisional application No. 63/348,455, filed on Jun. 2, 2022.

(51) Int. Cl.
　　*G11C 29/32*　　(2006.01)
　　*G11C 29/12*　　(2006.01)
(52) U.S. Cl.
　　CPC .......... *G11C 29/32* (2013.01); *G11C 29/1201* (2013.01)
(58) Field of Classification Search
　　CPC ........................... G11C 29/32; G11C 29/1201
　　See application file for complete search history.

(56) References Cited

U.S. PATENT DOCUMENTS

| | | | |
|---|---|---|---|
| 9,442,662 B2 * | 9/2016 | Dancho | G11C 11/5628 |
| 9,632,706 B2 * | 4/2017 | Ojalvo | G06F 3/064 |
| 9,899,092 B2 * | 2/2018 | Micheloni | G11C 29/028 |
| 10,692,543 B2 * | 6/2020 | Na | G11C 16/12 |
| 10,930,358 B2 * | 2/2021 | Kim | G11C 11/5671 |
| 11,133,074 B1 * | 9/2021 | Li | G11C 16/3472 |
| 2010/0199019 A1 | 8/2010 | Fisher et al. | |
| 2014/0231954 A1 | 8/2014 | Lue | |
| 2016/0179386 A1 | 6/2016 | Zhang | |
| 2017/0220623 A1 | 8/2017 | Blount et al. | |
| 2018/0285258 A1 | 10/2018 | Muchherla et al. | |

(Continued)

FOREIGN PATENT DOCUMENTS

WO　　　2017074570 A1　　5/2017

OTHER PUBLICATIONS

Choudhuri, et al., "Performance Improvement of Block Based NAND Flash Translation Layer", retrieved from https://www.ics.uci.edu/~givargis/pubs/C32.pdf., Sep. 30-Oct. 3, 2007, 6 pages.

*Primary Examiner* — Vanthu T Nguyen
(74) *Attorney, Agent, or Firm* — Brooks, Cameron & Huebsch, PLLC

(57)　　　　　　ABSTRACT

A method includes determining, for a plurality of memory dice, binning information relating to quality characteristics of each of the plurality of memory dice. The method further includes performing a select gate scan to determine a first threshold voltage and a first threshold voltage window of each of the plurality of memory dice, and, based on the determined quality characteristics of each of the plurality of memory dice, perform an erase and program operation to set a second threshold voltage with a second threshold voltage window of a subset of memory dice among the plurality of memory dice where the second threshold voltage window is greater than the first threshold voltage window.

20 Claims, 5 Drawing Sheets

(56)       References Cited

U.S. PATENT DOCUMENTS

| 2018/0349041 | A1 |    | 12/2018 | Zhou et al. | |
|---|---|---|---|---|---|
| 2021/0157723 | A1 |    | 5/2021 | Byun | |
| 2023/0409230 | A1 | * | 12/2023 | Prakash | G11C 16/0483 |
| 2023/0410912 | A1 | * | 12/2023 | Prakash | G11C 16/26 |

\* cited by examiner

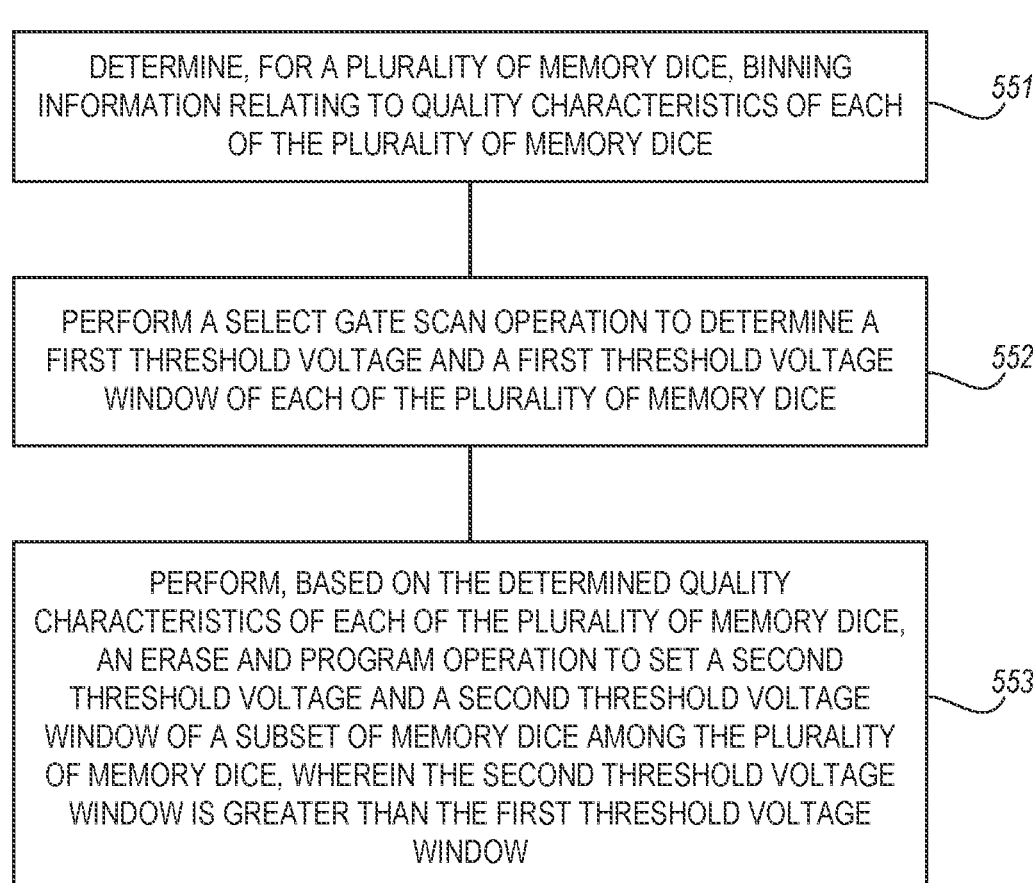

550

DETERMINE, FOR A PLURALITY OF MEMORY DICE, BINNING INFORMATION RELATING TO QUALITY CHARACTERISTICS OF EACH OF THE PLURALITY OF MEMORY DICE — 551

PERFORM A SELECT GATE SCAN OPERATION TO DETERMINE A FIRST THRESHOLD VOLTAGE AND A FIRST THRESHOLD VOLTAGE WINDOW OF EACH OF THE PLURALITY OF MEMORY DICE — 552

PERFORM, BASED ON THE DETERMINED QUALITY CHARACTERISTICS OF EACH OF THE PLURALITY OF MEMORY DICE, AN ERASE AND PROGRAM OPERATION TO SET A SECOND THRESHOLD VOLTAGE AND A SECOND THRESHOLD VOLTAGE WINDOW OF A SUBSET OF MEMORY DICE AMONG THE PLURALITY OF MEMORY DICE, WHEREIN THE SECOND THRESHOLD VOLTAGE WINDOW IS GREATER THAN THE FIRST THRESHOLD VOLTAGE WINDOW — 553

*FIG. 5*

MEMORY SUB-SYSTEM THRESHOLD VOLTAGE MODIFICATION OPERATIONS

PRIORITY INFORMATION

This application claims the benefit of U.S. Provisional Application No. 63/348,455, filed on Jun. 2, 2022, the contents of which are incorporated herein by reference.

TECHNICAL FIELD

Embodiments of the disclosure relate generally to memory sub-systems, and more specifically, relate to memory sub-system threshold voltage modification operations.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 5 is a flow diagram corresponding to a method for threshold voltage modification operations in accordance with some embodiments of the present disclosure.

DETAILED DESCRIPTION

Figure 1:
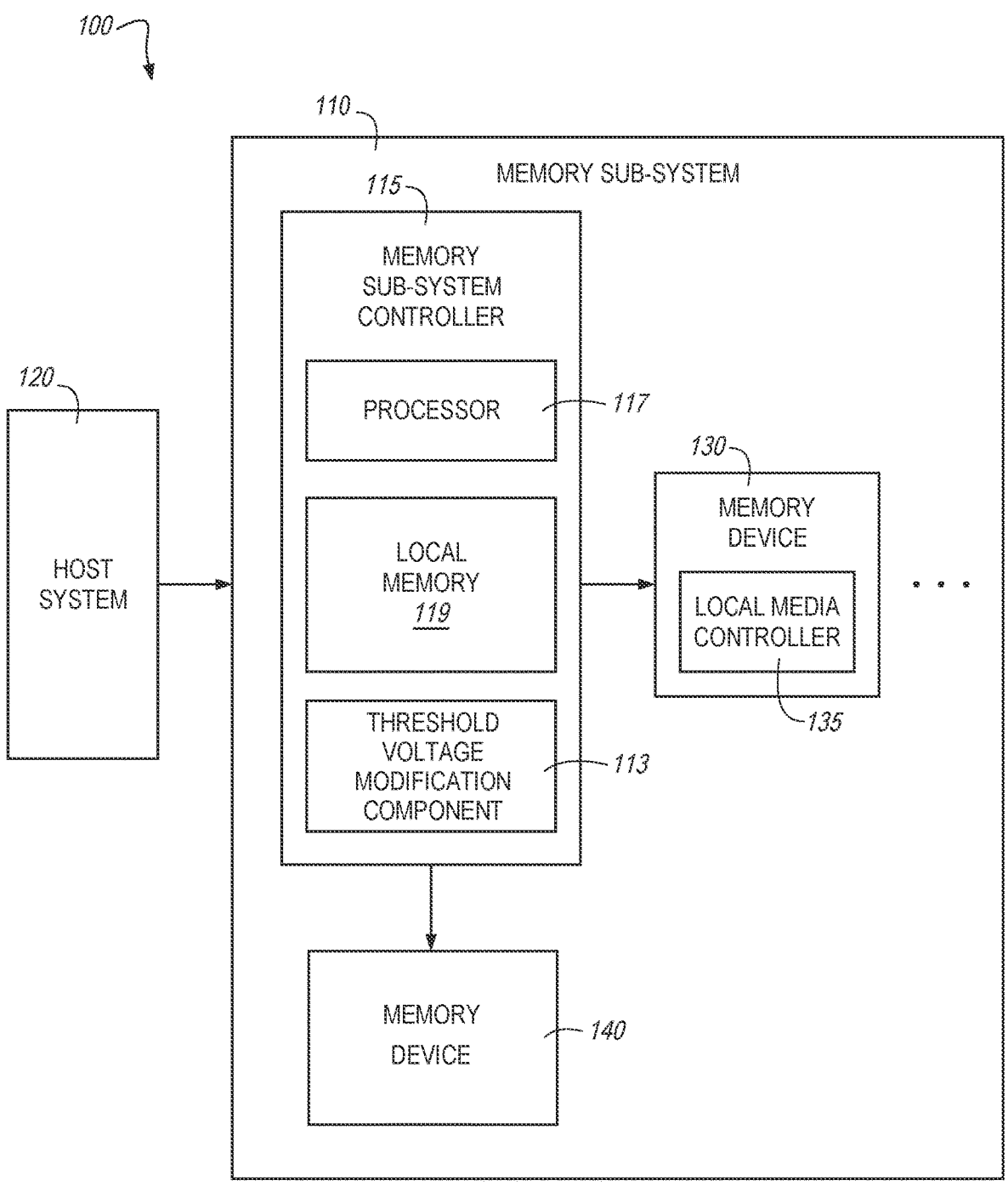
FIG. 1 illustrates an example computing system that includes a memory sub-system in accordance with some embodiments of the present disclosure.

Aspects of the present disclosure are directed to memory sub-system threshold voltage modification operations, in particular to memory sub-systems that include a memory sub-system threshold voltage modification component. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be grouped into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area that can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

In general, the constituent components of a memory device (e.g., memory dice that are used within a memory device) are manufactured on what is referred to in the industry as a "wafer." Due to process variations that may occur during manufacture of such wafers, among other inherent manufacturing variabilities, defects, etc. that may occur during the manufacture of the wafer, the resulting memory dice may have varying reliability margins (e.g., different reliability characteristics that can impact the quality of the memory dice). The threshold voltage window associated with each of the memory dice can be one value used to determine a reliability margin associated with a memory die. As used herein, a "threshold voltage window" generally refers to an amount of space in terms of voltage that includes voltages that correspond to an erased state of a memory cell, a programmed state of a memory cell, and a highest valid read state of a memory cell.

The variation of the threshold voltage window among dice can be quite large as a result of the distance of the memory die from a center portion of the wafer during manufacture, as well as process variations described above. Each individual die can be marked according to its quality (e.g., the reliability margin) and sorted with other die that have similar characteristics. These processes can be referred to as binning, where a particular die is placed in a bin corresponding to its determined quality. Memory systems may usually use dice in the bin with reliability margins above a threshold reliability margin to incorporate into a finished memory device. Die within a certain reliability margin range can generally be erased and programmed with a similar threshold voltage window. However, these methodologies may result in rejecting more memory dice for incorporation into memory devices than is desirable.

Having to reject dice that do not meet the reliability standard can result in an increased cost of the end product. For example, more memory dice may be required to be produced to yield an amount of quality die (e.g., memory dice having reliability margins above the threshold reliability margin) to incorporate into an SSD device to be used by a consumer. The resulting die that cannot be incorporated into products may be disregarded. In addition to increasing cost, this waste can have negative environmental impacts due to the use of raw materials that end up unused or disposed of.

In some embodiments, a high temperature data retention (HTDR) value can be a factor in determining the reliability margin of memory dice. As used herein, the term "HTDR" generally refers to phenomena in which the ability of memory cells to accurately store and retain data decreases as the temperature to which the memory cells are exposed increases. Similar to the threshold voltage window, the ability of memory cells of a memory die to retain data when expose to high temperatures (e.g., as a result of extended use) can vary among the die produced from a wafer.

Aspects of the present disclosure address the above and other deficiencies by altering the threshold voltage and/or the threshold voltage window associated with the plurality of memory dice of a memory sub-system prior to using a memory device (e.g., during manufacture of the memory device and/or during testing of the memory device), although embodiments are not so limited. For example, in some embodiments, a processor (i.e. the threshold voltage modification component 113 of FIG. 1) can perform an erase and program operation to set the threshold voltage and/or the threshold voltage window of the memory dice of the memory device to a similar voltage and window size based on the reliability margins, binning characteristics, etc. of the memory dice.

One such alteration or adjustment of the threshold voltage window can be made to increase the window size of at least some memory dice (e.g., memory dice that may fall below the threshold reliability margin) in order to increase the reliability of the overall memory device. By increasing the threshold voltage window of at least some of the memory dice associated with the memory device (e.g., memory dice that may fall below the threshold reliability margin), the resulting memory device may have a better reliability margin and therefore may satisfy the system needs of the memory device for a particular use. Further, by increasing the altering the threshold voltage window of at least some of the memory dice that are used in the memory device, the costs and waste associated with discarding memory dice that fall below the threshold reliability margin, as described above, may be mitigated and/or reduced.

The threshold voltage and threshold voltage window of the memory dice before modification can be referred to as the first threshold voltage and first threshold voltage window. The first threshold voltage and first threshold voltage window can be used to examine read window budget (RBW) based on the cell memory cell distribution. (i.e., the lower tail voltage and the upper tail voltage of a threshold voltage distribution plot of FIG. 4). The RBW can be used to determine the reliability margins of the memory dice.

The threshold voltage and threshold voltage window of the memory dice after modification can be referred to as the second threshold voltage and second threshold voltage window. The second threshold voltage and second threshold voltage window can be the trim settings of the memory dice after the modification operation has been performed. The trim setting can also be used to determine and verify the tail of the voltage distribution, but not the upper tail (i.e., the left-hand threshold voltage plot of FIG. 4). Based on the binning characteristics of the memory dice, we can apply different trim settings to each die of the memory dice with the optimal window setting.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via the same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a threshold voltage modification component 113. Although not shown in FIG. 1 so as to not obfuscate the drawings, the threshold voltage modification component 113 can include various circuitry to facilitate modifying threshold voltage characteristics for a memory sub-system and/or components of the memory sub-system, determining whether to perform threshold voltage modification operations for the memory sub-system and/or components of the memory sub-system based on determined quality characteristics of the memory sub-system and/or components of the memory sub-system, and/or controlling performance of threshold voltage modification operations for the memory sub-system and/or the components of the memory sub-system. In some embodiments, the threshold voltage modification component 113 can include special purpose circuitry in the form of an ASIC, FPGA, state machine, and/or other logic circuitry that can allow the threshold voltage modification component 113 to orchestrate and/or perform operations to selectively perform threshold voltage modification operations for the memory device 130 and/or the memory device 140 based on determined quality characteristics and/or reliability characteristics of the memory devices and/or memory dice.

In some embodiments, the memory sub-system controller 115 includes at least a portion of the threshold voltage modification component 113. For example, the memory sub-system controller 115 can include a processor 117 (processing device) configured to execute instructions stored in local memory 119 for performing the operations described herein. In some embodiments, the threshold voltage modification component 113 is part of the host system 110, an application, or an operating system.

In a non-limiting example, an apparatus (e.g., the computing system 100) can include a memory sub-system threshold voltage modification component 113. The memory sub-system threshold voltage modification component 113 can be resident on the memory sub-system 110. As used herein, the term "resident on" refers to something that is physically located on a particular component. For example, the memory sub-system threshold voltage modification component 113 being "resident on" the memory sub-system 110 refers to a condition in which the hardware circuitry that comprises the memory sub-system threshold voltage modification component 113 is physically located on the memory sub-system 110. The term "resident on" can be used interchangeably with other terms such as "deployed on" or "located on," herein.

The memory sub-system threshold voltage modification component 113 can be configured to determine, for memory dice, binning information relating to quality characteristics of each of the memory dice of the memory device 130/140. As part of determining the quality characteristics of each of the memory dice, the threshold voltage modification component 113 can determine a reliability margin for each of the memory dice. The quality characteristics of each of the memory dice can also be based, in part, on the physical location of a wafer at which the memory dice were fabricated.

Aspects of the present disclosure address the above and other deficiencies by modifying the threshold voltages and threshold voltage windows of memory dice of a memory device. As described in more detail, herein, embodiments of the present disclosure allow for characteristics (e.g., quality characteristics) of memory dice in a memory device or memory sub-system to be determined and/or ranked as part of performance of threshold voltage modification operations. As used herein, the term "quality characteristics," and variants thereof, generally refer to quantifiable attributes of a memory die, and/or the constituent components thereof, that affect the performance of the memory die and, therefore, the memory device or memory sub-system in which the memory die is deployed.

The quality characteristics of each of the memory dice can also be based, in part, on a Fuse_ID corresponding to respective memory dice among the plurality of memory dice. The relative locations on the wafer at which the memory dice were fabricated can be referred to as a "fuse_ID." As an example, because manufacturing process variation can lead to memory dice that are fabricated at the edge of the wafer having generally lower quality characteristics than those memory dice that are fabricated closer to the center of the wafer (or, vice-versa), embodiments herein allow for the relative location of the memory dice with respect to the wafer during fabrication (e.g., the respective fuse_IDs of the memory dice) to be used in connection with determining the quality characteristics of each of the plurality of memory dice. As described above, the memory components can be memory dice or memory packages that form at least a portion of the memory device 130.

The memory sub-system threshold voltage modification component 113 can be further configured to perform a select gate scan to determine a first threshold voltage and a first threshold voltage window of each of the memory dice. The memory sub-system threshold voltage modification component 113 can further be configured to perform, based on the determined quality of characteristics of each of the memory dice, an erase and program operation to set a second threshold voltage with a second threshold voltage window of a subset of memory dice among the memory dice, where the second threshold voltage window is great that the first threshold voltage window In some embodiments, the memory sub-system threshold voltage modification component 113 can determine a high temperature data retention (HTDR) value of each of the plurality of memory dice. In other words, the threshold voltage modification component 113 can determine the ability of each of the dice to retain information when exposed to high temperatures.

In some embodiments, the memory sub-system threshold voltage modification component 113 that can be further configured to set the second threshold voltage and the second threshold voltage window that are the same for each subset of memory dice among the plurality of memory dice. For example, the threshold voltage modification component 113 can set all the memory dice of memory device to the same second threshold voltage window for better device performance and/or the threshold voltage modification component 113 can set memory dice that have similar reliability and/or quality characteristics to the same second threshold voltage window to improve performance of the memory device 130.

The memory sub-system threshold modification component 13 can be configured to perform the erase and program operation to set the second threshold voltage with the second threshold voltage window of the subset of memory dice among the plurality of memory dice where a first subset and a second subset of memory dice have different second threshold voltages and different second threshold voltage windows. In other words, the plurality of memory dice can be divided into two subsets, or more, of memory dice, and each subset can have its own second threshold voltage value and its own second threshold voltage window. In another embodiment, a third threshold voltage window can be set to one of the first subset of memory dice or the second subset of memory dice, or both. In other words, the threshold modification component 113 can set multiple subsets of memory die to different second threshold voltages and second threshold voltage windows. In another embodiment, there can be three subsets and all the subsets have different voltage thresholds and voltage threshold windows.

In another non-limiting example, a system (e.g., the computing system 100) can include a memory sub-system 110 comprising memory components arranged to form a stackable cross-gridded array of memory cells. A processing device (e.g., threshold voltage modification component 113, the processor 117, and/or the local media controller 135) can be coupled to the memory components and can perform various scans (e.g., a threshold voltage scan, a select gate scan, etc.) of each memory die of the plurality of memory dice to determine a first threshold voltage and a first threshold voltage window for each memory die of the plurality of memory dice. The processing device can be further configured to perform operations comprising performing an erase and program operation to set a second threshold voltage with a second threshold voltage window of each memory die of the plurality of memory dice, where the second threshold window is greater than the first threshold window.

In some embodiments, the system can include testing circuitry. In such embodiments, a processor is resident on the testing circuitry, and the memory device is couplable to the testing circuitry and the processor.

Figure 2:
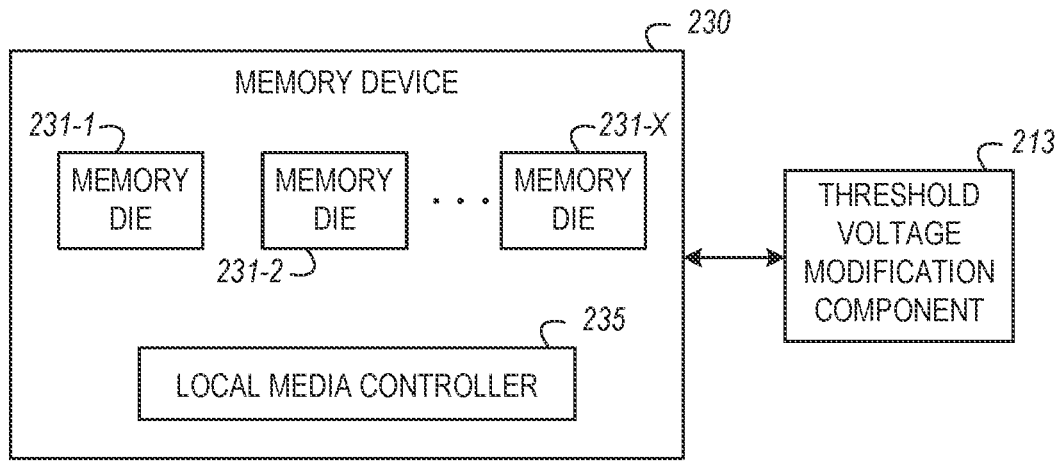
FIG. 2 illustrates an example of a memory device that includes multiple memory dice in accordance with some embodiments of the present disclosure.

FIG. 2 illustrates an example of a memory device 230 that includes multiple memory dice 231-1 to 231-X in accordance with some embodiments of the present disclosure The memory device 230 can be analogous to the memory device 130 illustrated in FIG. 1, herein. As shown in FIG. 2, the memory device 230 can include multiple memory dice, such as the memory die 231-1, the memory die 231-2, up to the memory die 230-X, as well as a local media controller 235, which can be analogous to the local media controller 125 illustrated in FIG. 1. Further, as shown in FIG. 2, the memory device 230 is coupled to a threshold modification component 213, which can be analogous to the threshold modification component 113 illustrated in FIG. 1, herein.

In some embodiments, the memory dice 231-1 to 231-X are flash NAND memory dice. For example, each of the memory dice 231-1 to 231-X can include one or more arrays of memory cells (not shown so as to not obfuscate the drawing) such as single level cells (SLCs) or multi-level cells (MLCs) (e.g., triple level cells (TLCs) or quad-level cells (QLCs)). In some embodiments, a particular memory die 231-1 to 231-X can include an SLC portion, and an MLC portion, a TLC portion, and/or a QLC portion of memory cells. Each of the memory cells can store one or more bits of data used by the host system (e.g., the host system 120 illustrated in FIG. 1, herein). Furthermore, the memory cells of the memory dice 231-1 to 231-X can be grouped as memory pages or memory blocks that can refer to units of the memory dice 231-1 to 231-X that are used to store data.

Figure 3:
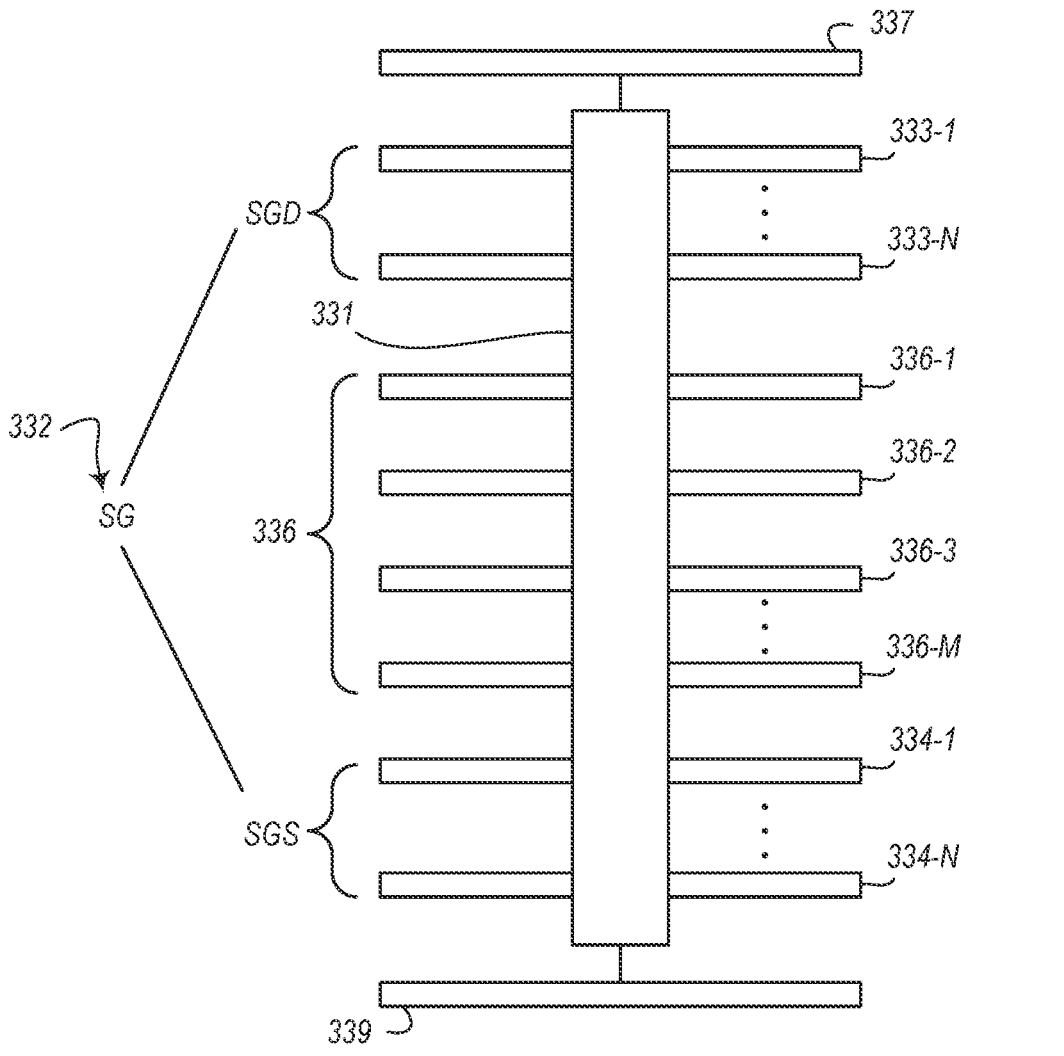
FIG. 3 illustrates an example cross-sectional view of a portion of a memory die that includes a string of memory cells coupled to select gates and word lines in accordance with some embodiments of the present disclosure.

FIG. 3 illustrates an example cross-sectional view of a portion of a memory die (e.g., one of the memory dice 231-1 to 231-X illustrated in FIG. 2) that includes a string of memory cells 331 coupled to select gates (SG) 332 and word lines 336 in accordance with some embodiments of the present disclosure. As shown in FIG. 3, the string of memory cells 331 is further coupled to a bit line 337 and a source line 339. So as to not obfuscate the drawings, individual memory cells corresponding to the strings of memory cells 331 are not shown; however, it will be appreciated by one of ordinary skill in the art that the string of memory cells 331 includes multiple memory cells that are coupled to respective word lines 336 among the word lines 336-1, 336-2, 336-to 336-M illustrated in FIG. 3. The select gates (SG) 332 comprise a drain region (SGD) 331-1 to 331-N and can be referred to in the alternative as "upper select gates," herein. In addition, the select gates (SG) 332 comprise a source region (SGS) 334-1 to 334-N and can be referred to in the alternative as "lower select gates," herein.

As described herein, a threshold voltage modification component (e.g., the threshold voltage modification component 213 illustrated in FIG. 2) can control performance of scan operations that involve the select gates (SG) 332. For example, a processor (e.g., the threshold voltage modification component 213 illustrated in FIG. 2) can determine binning information relating to quality characteristics of each of a plurality of memory dice and can perform a select gate scan of each memory die of the plurality of memory dice. The processor (e.g., the threshold voltage modification component 213 illustrated in FIG. 2) can determine a first a first threshold voltage and a first threshold voltage window of each memory die of the plurality of memory dice based, at least in part, on the select gate scan of each memory die. The processor can then perform an erase and program operation to set a second threshold voltage with a second threshold window of each memory die of the plurality of memory dice.

In a non-limiting example, an apparatus includes a memory die (e.g., one or more of the memory dice 231-1 to 231-X illustrated in FIG. 2) resident on a memory device (e.g., the memory device 230 illustrated in FIG. 2). A select gate (SG) 332 is coupled to at least one string 331 of memory cells of the memory die. A processor (e.g., the threshold voltage modification component 213 illustrated in FIG. 2) coupled to the memory device and is configured to determine a reliability margin for each of the plurality of memory dice as part of determining the quality characteristics of each of the plurality of memory dice. The SG 332 can be selected or de-selected to read sub-blocks to be read from the memory die based on threshold voltage modification operations described herein.

In some embodiments, the processor (e.g., the threshold voltage modification component 213 illustrated in FIG. 2) can sweep the read level and/or word lines 336 voltage to determine the threshold voltage distribution. Using the threshold voltage distribution, the processor can calculate the read window budget (RWB) to determine the reliability margin and die binning characteristics. In some embodiments, the threshold voltage distribution can be used to calculate the upper and/or lower tail of the distributions shown in FIG. 4 to determine reliability characteristics (e.g., RWB, etc.) and/or binning characteristics of the memory dice.

In some embodiments, the quality characteristics of each of the plurality of memory dice are based, at least in part, on the physical location of a wafer at which the memory dice were fabricated. In further embodiments, the quality characteristics of each of the plurality of memory dice are based, at least in part, on a FUSE_ID corresponding to respective memory dice among the plurality of memory dice.

In some embodiments, the processor (e.g., the threshold voltage modification component 213 illustrated in FIG. 2) can determine a high temperature data retention (HTDR) value of each of the plurality of memory dice.

In some embodiments, the second threshold voltage and the second threshold voltage window are the same for each subset of memory dice among the plurality of memory dice. In another non-limiting example, the processor (e.g., the threshold voltage modification component 213 illustrated in FIG. 2), when performing the erase and program operation to set the second threshold voltage with the second threshold voltage window of each memory die of the plurality of memory dice, sets a first subset of memory dice of the plurality of memory dice and a second subset of memory dice of the plurality of memory dice to different second threshold voltages, wherein the first subset of memory dice have the same second threshold voltage and second threshold voltage window and the second subset of memory dice have the same second threshold voltage and second threshold voltage window.

Figure 4:
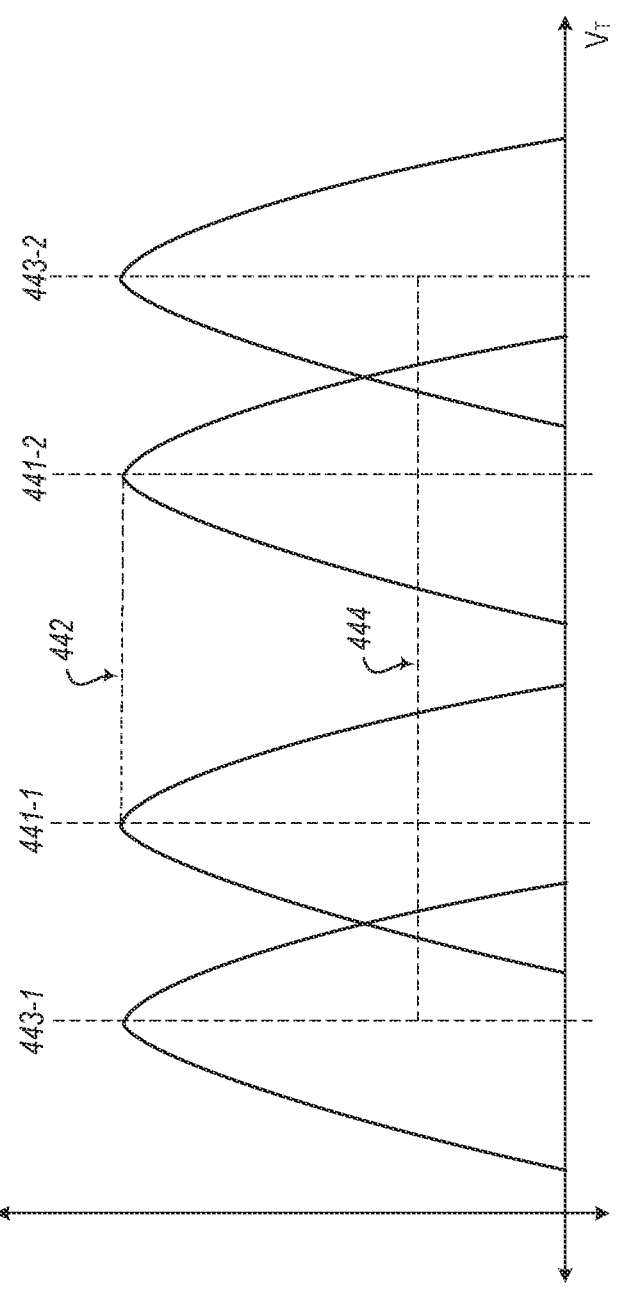
FIG. 4 illustrates an example of a threshold voltage (Vr) distribution plot for a memory dice in accordance with some embodiments of the present disclosure.

FIG. 4 illustrates an example of a threshold voltage ($V_T$) distribution plot for a memory die (i.e., memory die 231-1 to 231-X) in accordance with some embodiments of the present disclosure. In FIG. 4, the threshold voltage ($V_T$) distribution plot shows the first threshold voltages 441-1 and 441-2, the first threshold voltage window 442, the second threshold voltages 443-1 and 443-2, and the second threshold voltage window 444. Curves 441-1 and 441-2 can represent the first or initial threshold voltage of a given memory die of the memory device (e.g., memory device 130 and 230 of FIGS. 2 and 3), and line plot 442 can represent the first or initial threshold voltage window of the given memory die.

For example, the first or initial threshold voltage 441 can be determined (by, for example, a processor). The processor can perform an erase and program operation to set the second threshold voltage 443 with a second threshold voltage window 444.

FIG. 5 is a flow diagram corresponding to a method 550 for threshold voltage modification operations in accordance with some embodiments of the present disclosure. The method 550 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 550 is performed by the threshold voltage modification component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 551, binning information relating to quality characteristics of each of the plurality of memory dice can be determined. In some approaches, a reliability margin can be determined for each of the plurality of memory dice as part of determining the quality characteristics of each of the plurality of memory dice. Additionally, in some approaches, a high temperature data retention (HTDR) value of each of the plurality of memory dice can also be determined.

At operation 552, a select gate scan operation to determine a first threshold voltage and a first threshold voltage window of each of the plurality of memory dice can be performed. At operation 553, an erase and program operation, based on the determined quality characteristics of each of the plurality of memory dice, can be performed to set a second threshold voltage with a second threshold voltage window of a subset of memory dice among the plurality of memory dice, where the second threshold voltage window is greater than the first threshold voltage window.

In some approaches, the second threshold voltage and the second threshold voltage window are the same for each subset of memory dice among the plurality of memory dice. However, in some approaches, during performance of the erase and program operation to set the second threshold voltage with the second threshold voltage window of the subset of memory dice among the plurality of memory dice, a first subset of memory dice and a second subset of memory dice are set to different second threshold voltages, where the first subset of memory dice have the same second threshold voltage and the second threshold voltage window and the second subset of memory dice have the same second threshold voltage and second threshold voltage window. In additional approaches, a third threshold voltage window can be set to one of the first subset of memory dice or the second subset of memory dice, or both.

Figure 6:
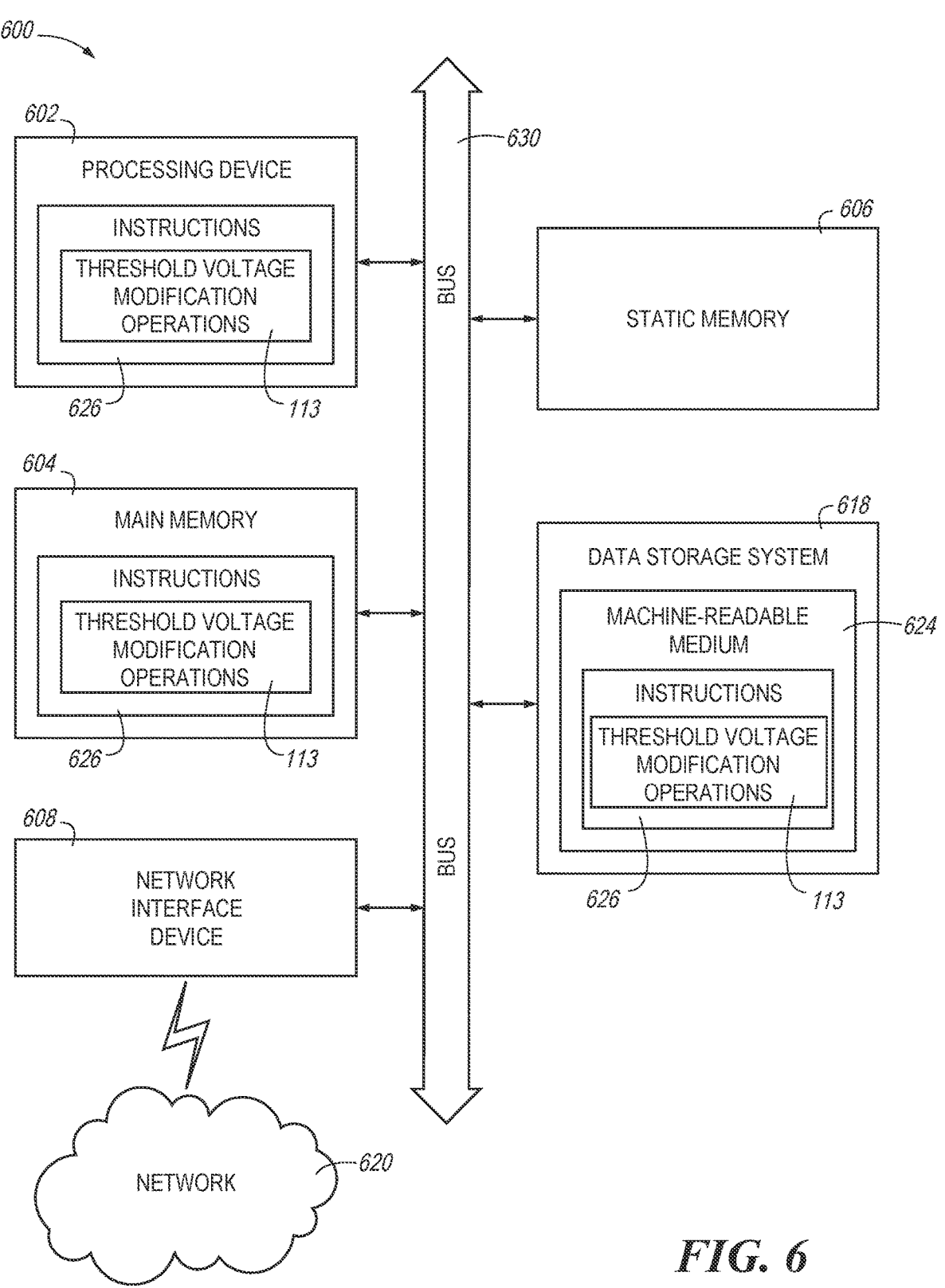
FIG. 6 is a block diagram of an example computer system in which embodiments of the present disclosure may operate.

FIG. 6 is a block diagram of an example computer system 600 in which embodiments of the present disclosure may operate. For example, FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the threshold voltage modification component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

The processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a threshold voltage modification component (e.g., the threshold voltage modification component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed:

1. A method, comprising:

determining quality characteristics of each of a plurality of memory dice, wherein determining quality characteristics includes determining a first pair of threshold voltage distributions, including a first distribution corresponding to an erased state and a second distribution corresponding to a programmed state, and a first threshold voltage window of each of the plurality of memory dice, and wherein the first threshold voltage window is a difference in voltage between the first pair of threshold voltage distributions;

sorting the plurality of memory dice into a plurality of bins based on the respective first pairs of threshold voltage distributions and first threshold voltage windows; and performing an erase and program operation to set a second pair of threshold voltage distributions, including a third distribution corresponding to a reduced erase state and a fourth distribution corresponding to an increased programmed state, with a second threshold voltage window for each memory die of a subset of the plurality of bins of memory dice that falls below a threshold reliability margin, wherein the second threshold voltage window is greater than the first threshold voltage window.

2. The method of claim 1, further comprising determining a reliability margin for each of the plurality of memory dice as part of determining the quality characteristics of each of the plurality of memory dice.

3. The method of claim 1, further comprising determining a high temperature data retention (HTDR) value of each of the plurality of memory dice.

4. The method of claim 1, wherein the second pair of threshold voltage distributions and the second threshold voltage window are the same for each subset of the plurality of bins of memory dice.

5. The method of claim 1, wherein performing the erase and program operation to set the second pair of threshold voltage distributions with the second threshold voltage window for each memory die of the subset of the plurality of bins of memory dice further comprises setting a first subset of memory dice and a second subset of memory dice to different second pairs of threshold voltage distributions, wherein the first subset of memory dice have the same second pair of threshold voltage distributions and second threshold voltage window and the second subset of memory dice have the same second pair of threshold voltage distributions and second threshold voltage window.

6. The method of claim 5, further comprising setting a third threshold voltage window to one of the first subset of memory dice or the second subset of memory dice, or both.

7. An apparatus, comprising:

a memory device comprising a plurality of memory dice;

a processor coupled to the memory device, wherein the processor is configured to:

perform a select gate scan of each memory die of the plurality of memory dice;

determine quality characteristics of each of the plurality of memory dice, wherein determining quality characteristics includes determining a first pair of threshold voltage distributions, including a first distribution corresponding to an erased state and a second distribution corresponding to a programmed state, and a first threshold voltage window of each memory die of the plurality of memory dice based, at least in part, on the select gate scan of each memory die; and perform an erase and program operation to set a second pair of threshold voltage distributions, including a third distribution corresponding to a reduced erase state and a fourth distribution corresponding to an increased programmed state, with a second threshold window of each memory die of the plurality of memory dice that falls below a threshold reliability margin.

8. The apparatus of claim 7, wherein the quality characteristics of each of the plurality of memory dice are based, at least in part, on a physical location of a wafer at which the memory dice were fabricated.

9. The apparatus of claim 7, wherein the quality characteristics of each of the plurality of memory dice are based, at least in part, on a Fuse ID corresponding to respective memory dice among the plurality of memory dice.

10. The apparatus of claim 7, wherein the processor is further configured to determine a reliability margin for each of the plurality of memory dice as part of determining the quality characteristics of each of the plurality of memory dice.

11. The apparatus of claim 7, wherein the processor is further configured to determine a high temperature data retention (HTDR) value of each of the plurality of memory dice.

12. The apparatus of claim 7, wherein the second pair of threshold voltage distributions and the second threshold voltage window are the same for each subset of memory dice among the plurality of memory dice.

13. The apparatus of claim 7, wherein performing the erase and program operation to set the second pair of threshold voltage distributions with the second threshold voltage window of each memory die of the plurality of memory dice the processor is further configured to set a first subset of memory dice of the plurality of memory dice and a second subset of memory dice of the plurality of memory dice to different second pairs of threshold voltage distributions, wherein the first subset of memory dice have the same second pair of threshold voltage distributions and second threshold voltage window and the second subset of memory dice have the same second pair of threshold voltage distributions and second threshold voltage window.

14. A system, comprising:

a plurality of memory dice resident on a memory device;

a processor coupled to the plurality of memory dice, wherein the processor is configured to:

determine quality characteristics of each of a plurality of memory dice, wherein determining quality characteristics includes determining a first pair of threshold voltage distributions, including a first distribution corresponding to an erased state and a second distribution corresponding to a programmed state, and a first threshold voltage window of each memory die of the plurality of memory dice; and perform an erase and program operation to set a second pair of threshold voltage distributions, including a third distribution corresponding to a reduced erase state and a fourth distribution corresponding to an increased programmed state, with a second threshold window of each memory die of the plurality of memory dice that falls below a threshold reliability margin, wherein the second threshold window is greater than the first threshold window.

15. The system of claim 14, wherein:

the system comprises testing circuitry, the processor is resident on the testing circuitry, and the memory device is couplable to the testing circuitry and the processor.

16. The system of claim 14, wherein:

system comprises testing circuitry, the memory device is resident on the testing circuitry, and the testing circuitry is couplable to the processor.

17. The system of claim 14, wherein the second pair of threshold voltage distributions and the second threshold voltage window are the same for each of the memory dice among the plurality of memory dice.

18. The system of claim 14, wherein the processor is further configured to determine, for the plurality of memory dice, binning information relating to quality characteristics of each of the plurality of memory dice.

19. The system of claim 14, wherein the processor is further configured to set a first subset of memory dice and a second subset of memory dice to different pairs of second threshold voltage distributions, wherein the first subset of memory dice have the same second pair of threshold voltage distributions and second threshold voltage window and the second subset of memory dice have the same pair of second threshold voltage distributions and second threshold voltage window.

20. The system of claim 19, wherein the processor is further configured to set a third threshold voltage window to one of the first subset of memory dice or the second subset of memory dice, or both.

\* \* \* \* \*